United States Patent [19]

Small

[11] Patent Number: 5,563,509
[45] Date of Patent: Oct. 8, 1996

[54] ADAPTABLE LOAD BOARD ASSEMBLY FOR TESTING ICS WITH DIFFERENT POWER/GROUND BOND PAD AND/OR PIN CONFIGURATIONS

[75] Inventor: Gary L. Small, Los Gatos, Calif.

[73] Assignee: VLSI Technology, Inc., San Jose, Calif.

[21] Appl. No.: 574,862

[22] Filed: Dec. 19, 1995

Related U.S. Application Data

[63] Continuation of Ser. No. 269,801, Jun. 30, 1994, abandoned.

[51] Int. Cl.$^6$ .................................................. G01R 31/00
[52] U.S. Cl. ..................... 324/158.1; 324/754; 324/761; 439/42
[58] Field of Search ............................. 324/158.1, 754, 324/761; 439/42

[56] References Cited

U.S. PATENT DOCUMENTS

| 3,654,585 | 4/1972 | Wickersham | 324/761 |
| 3,866,119 | 2/1975 | Ardezzone et al. | 324/754 |
| 4,232,928 | 11/1980 | Wickersham | 439/42 |
| 4,733,172 | 3/1988 | Smolley | 324/754 |

Primary Examiner—Kenneth A. Wieder
Assistant Examiner—Kourosh Cyrus Khosravi
Attorney, Agent, or Firm—Majestic, Parson, Siebert & Hsue

[57] ABSTRACT

An adapter unit configurable for testing ICs having different power and ground contact configurations is customized for one of such configuration and mounted on a load board having first and second plurality of signal contacts, wherein respective pairs of the first and second plurality of signal contacts are connected to both a contact of the IC and a test channel from an IC tester. The adapter unit is mounted on the load board making contact with the first plurality of signal contacts, while a DUT board holding the IC is mounted on the load board making contact with the second plurality of signal contacts. The adapter unit includes a plurality of signal contacts respectively connected to the first plurality of signal contacts of the load board, a power bus ring connected to a power line provided by the IC tester, and a ground bus ring connected to a ground line from the IC tester. The adapter unit is configured for a specific power and/or ground contact configuration by providing power jumpers connecting each of the signal contacts of the adapter unit connected to power contacts of the IC being tested to the power bus ring while the test channel connected to that signal contact is inactive, and by providing ground jumpers connecting each of the signal contacts of the adapter unit connected to ground contacts of the IC being tested to the ground bus ring while the test channel connected to that signal contact is inactive.

16 Claims, 8 Drawing Sheets

| 111 | P |
|-----|---|
| 112 | S |
| 113 | S |
| 114 | S |
| 115 | G |
| 116 | S |
| 117 | S |
| 118 | S |
| 119 | P |
| 120 | S |
| 121 | S |
| 122 | S |
| 123 | G |
| 124 | S |
| 125 | S |
| 126 | S |

FIG.2B

| 111 | G |
|-----|---|
| 112 | S |
| 113 | S |
| 114 | S |
| 115 | P |
| 116 | S |
| 117 | S |
| 118 | S |
| 119 | G |
| 120 | S |
| 121 | S |
| 122 | S |
| 123 | P |
| 124 | S |
| 125 | S |
| 126 | S |

FIG.2C

| 111 | S |
|-----|---|
| 112 | S |
| 113 | P |
| 114 | S |
| 115 | S |
| 116 | S |
| 117 | G |
| 118 | S |
| 119 | S |
| 120 | S |
| 121 | P |
| 122 | S |
| 123 | S |
| 124 | S |
| 125 | G |
| 126 | S |

ADAPTABLE LOAD BOARD ASSEMBLY FOR TESTING ICS WITH DIFFERENT POWER/GROUND BOND PAD AND/OR PIN CONFIGURATIONS

This is a continuation of application Ser. No. 08/269,801, filed Jun. 30, 1994, now abandoned.

BACKGROUND OF THE INVENTION

This invention relates in general to integrated circuit ("IC") test systems and in particular, to an IC test system readily adaptable to testing a variety of ICS having different power and ground bond pad configurations, or when packaged, different power and ground pin configurations.

Figure 1A:
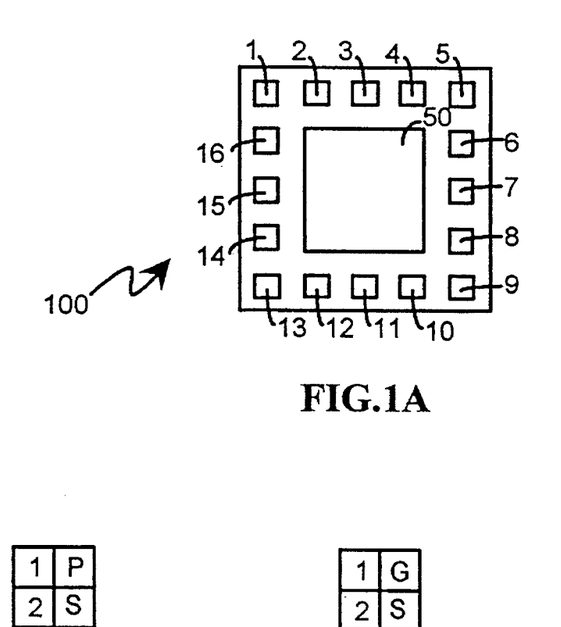
FIGS. 1A–1D illustrate, as examples, a top plan view of a simplified example of an integrated circuit die, and various bond pad assignments for the IC die.

Integrated circuits, especially those of the so-called application specific type, may have any one of a number of different power and ground bond pad and/or pin configurations. FIG. 1A illustrates, as a simplified example, a top plan view of one such IC die 100, wherein bond pads 1–16 provide external device electrical connection means to the active circuitry 50 of the IC die 100. Depending upon the functionality and layout of the active circuitry 50, some of the bond pads will be assigned by the layout designer to communicate input and/or output signals "S" to and/or from the active circuitry 50, at least one bond pad will be assigned to provide power "P" to the active circuitry 50, and at least one bond pad will be assigned to provide an external ground connection "G" to the active circuitry 50.

Figure 1B:
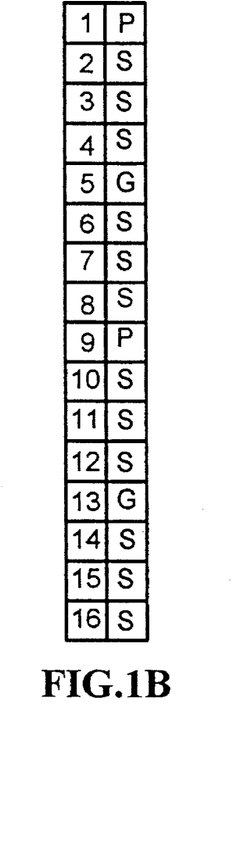
Figure 1C:
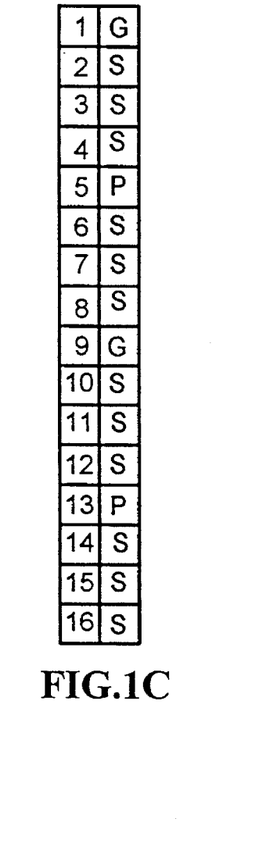
Figure 1D:
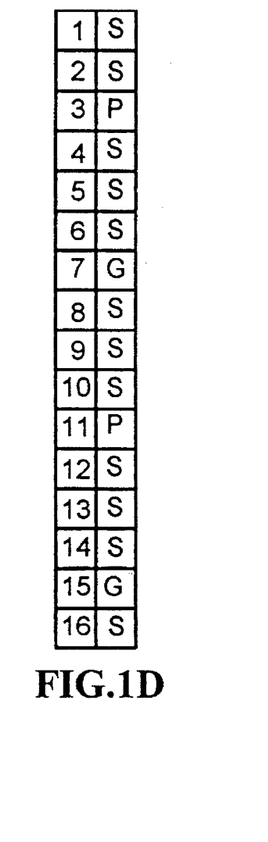

FIGS. 1B–1D illustrate examples of such possible bond pad assignments (also referred to herein as "bond pad configurations") for the IC die example of FIG. 1A. FIG. 1B illustrates one example where opposing corner bond pads 1 and 9 are assigned to be power "P" bond pads, opposing corner bond pads 5 and 13 are assigned to be ground "G" bond pads, and the remaining bond pads are assigned to be input and/or output signal "S" bond pads; FIG. 1C illustrates a second example where the power "P" and ground "G" bond pad assignments have been reversed; and FIG. 1D illustrates a third example where the power "P" and ground "G" bond pad assignments are not in the corner bond pads.

Figure 2A:
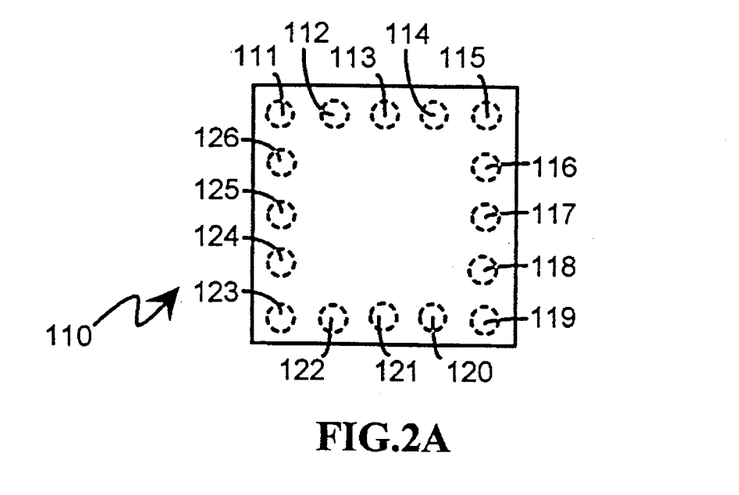
FIGS. 2A–2D illustrate, as examples, a top plan view of a packaged integrated circuit including the die of FIG. 1A, and various pin assignments for the packaged IC.
Figure 2B:
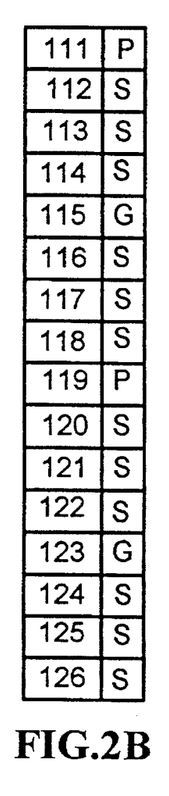
Figure 2C:
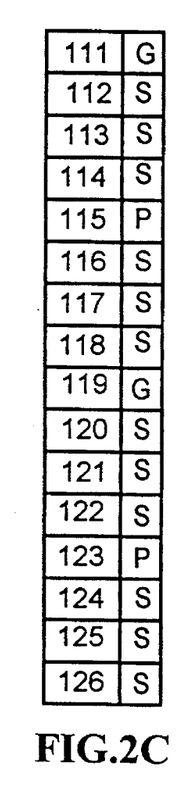
Figure 2D:
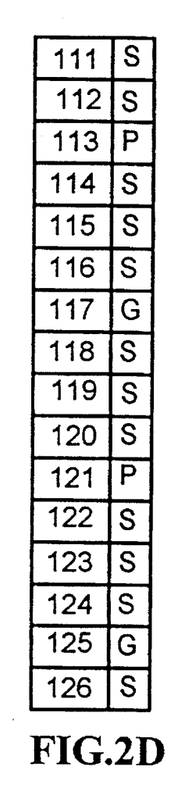

Similarly, for packaged integrated circuits, power and ground pin assignments may be different between various ICS, because of differences in their die layouts or differences in the board layouts wherein the packaged ICS are to be inserted. FIG. 2A illustrates, as a simplified example, a top plan view of a packaged IC 110 having pins 111–126 (shown as dotted circles) extending out of its bottom, and FIGS. 2B–2D illustrate examples of pin assignments for the packaged IC 110 of FIG. 2A.

Figure 3:
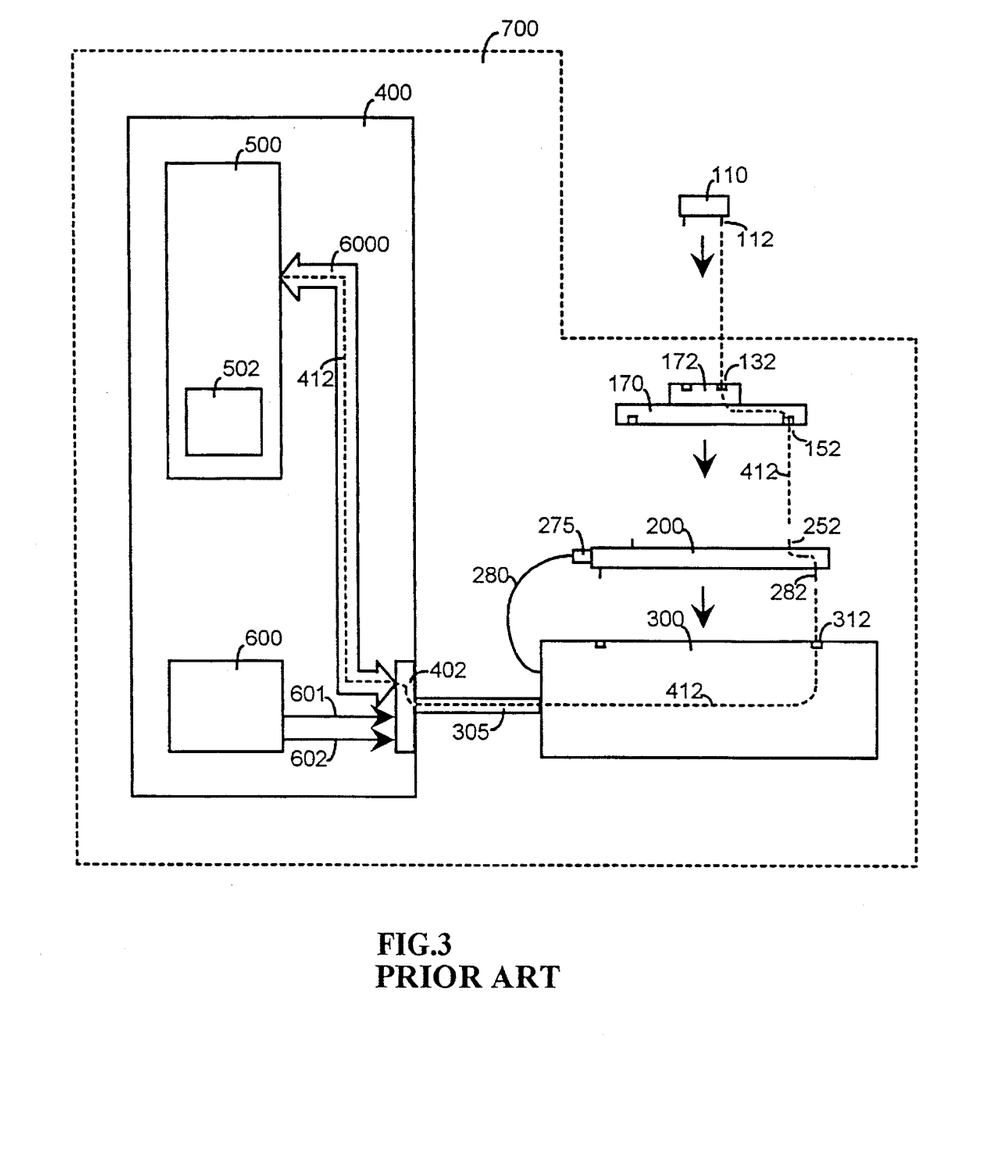
FIG. 3 illustrates a simplified example of a prior art test system for testing integrated circuits.

FIG. 3 illustrates, as an example, a test system 700 for testing the packaged IC 110. Included in the test system 700 is an IC tester 400 having a plurality of test channels 6000 which provide test stimuli to and receive the resulting responses from the packaged IC 110 through connections connecting each of the pins 1–16 of the packaged IC 110 to a corresponding one of the test channels 6000 (e.g., pins 1–16 connected in sequential one-to-to correspondence with test channels 6001–6016 of test channels 6000, wherein pin 1 is connected to test channel 6001, pin 2 is connected to test channel 6002, and so on, to pin 16 which is connected to test channel 6016). Dotted line 412 illustrates the path of one such connection from pin 112 of the packaged IC 110 to the IC tester 400. Although not shown, similar connection paths to each of the remaining pins of the packaged IC 110 are also provided.

In practice, a number of mechanical structures are employed to electrically connect the pins of the packaged IC 110 to their respectively preassigned test channels 6001–6016. For example, the packaged IC 110 may be mounted onto an IC holder 172 (FIG. 4) having a plurality of contacts 131–146 which make electrical connections with respective pins 111–126 of the packaged IC 110 when mounted on the IC holder 172 (e.g., pins 1–16 making electrical connection in sequential one-to-one correspondence with contacts 131–146). The IC holder 172 is in turn, mounted on a device-under-test ("DUT") board 170 (FIG. 4) having a plurality of bottom contacts 151–166, wherein each of the bottom contacts 151–166 is electrically connected through conventional means to a respective one of the plurality of contacts 131–146 of the IC holder 172 (e.g., IC holder 172 contacts 131–146 making electrical connection in sequential one-to-one correspondence with DUT board 170 contacts 151–166).

Figure 4:
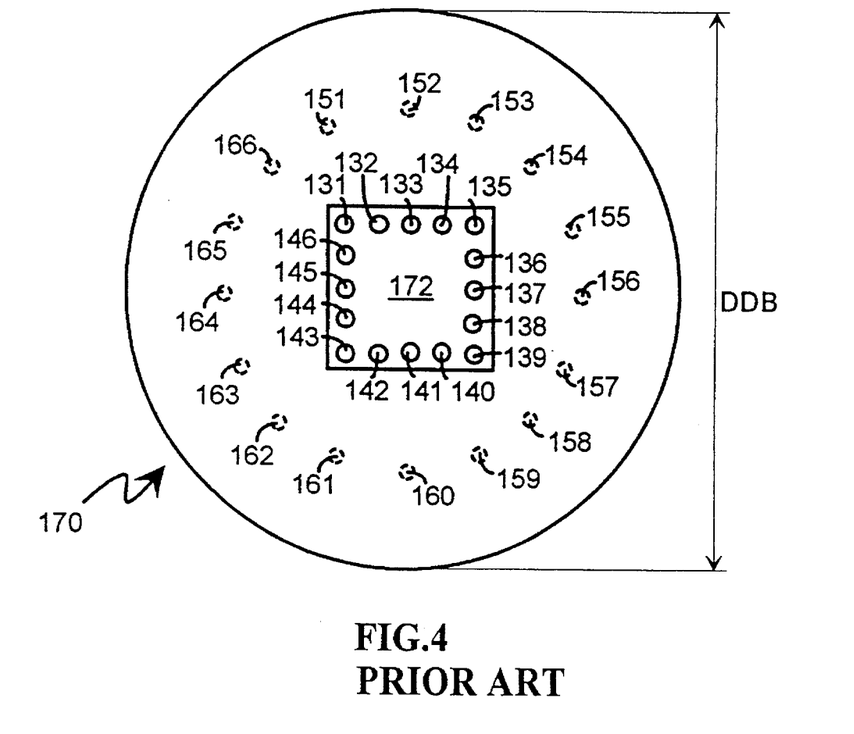
FIG. 4 illustrates a top plan view of a simplified example of a device-under-test board for holding the packaged integrated circuit of FIG. 2A during test.

The DUT board 170 is in turn, mounted on a load board 200 (FIGS. 5A and 5B), such that each of the bottom contacts 151–166 of the DUT board 170 makes electrical contact with a corresponding signal contact 251–266 formed on a top surface 202 (FIG. 5A) of the load board 200 (e.g., DUT board 170 contacts 151–166 making electrical connection in sequential one-to-one correspondence with load board 200 signal contacts 251–266). Electrically connected through conventional means to each of the top surface signal contacts 251–266 of the load board 200 is a corresponding bottom contact 281–296 formed on a bottom surface 204 (FIG. 5B) of the load board 200 (e.g., top surface signal contacts 251–266 making electrical connection in sequential one-to-one correspondence with bottom surface contacts 281–296).

The load board 200 is in turn, mounted on a test head 300, such that each of the bottom contacts 281–296 of the load board 200 makes electrical contact with corresponding contacts 311–326 (only 311 shown) formed on the test head 300 (e.g., load board 200 contacts 281–296 making electrical connection in sequential one-to-one correspondence with test head 300 contacts 311–326). Finally, the test head 300 contacts 311–326 are connected to corresponding ones of the test channels 6000 of the IC tester 400 through a cable 305 connected through connector 402 to the IC tester 400 (e.g., test head contacts 311–326 making electrical connection in sequential one-to-one correspondence with selected test channels 6001–6016 of the test channels 6000).

When power or ground connections are to be made to one of the pins of the packaged IC 110, instead of an input and/or output signal, the test channels connected to those selected pins are generally inactivated and means to switchably connect separate power and ground lines to those pins is required since the IC tester 400 does not supply enough current through its test channels 6000 for such power and ground connections. Where the load board 200 includes such means to switchably connect the separate power and ground lines to the power and ground pins, respectively, of the packaged IC 110, the separate power and ground lines (e.g., 601 and 602, respectively) may be provided to the load board 200 from the IC tester 400 via cable 305 which provides electrical signals from the IC tester 400 to the test head 300, and ribbon cable 280 which provides selected electrical signals from the test head 300 to the load board 200. In addition to providing connections to the power and ground lines 601 and 602, respectively, ribbon cable 280 may also provide additional electrical signals activating and/or controlling certain components performing the function on the load board 200 of switchably connecting the power and ground lines 601 and 602, respectively, to the power and ground pins of the packaged IC 110.

One example of a means of providing the power and ground lines 601 and 602, respectively, to the power and ground pins of the packaged IC 110 is to employ a dedicated load board for each specific power and ground bond pad and/or pin configuration. For example, instead of electrically connecting all of the pins of the packaged IC 110 to test channels, only pins dedicated to input and/or output signals would be electrically connected to selected test channels. Pins dedicated as power and ground pins would be electrically connected through conventional hardwiring techniques, for example, to their respective power and ground lines. The problem with such an approach, however, is that load boards are very expensive. Therefore, having a dedicated load board for each different power and ground bond pad or pin configuration is commercially impractical.

Figure 5A:
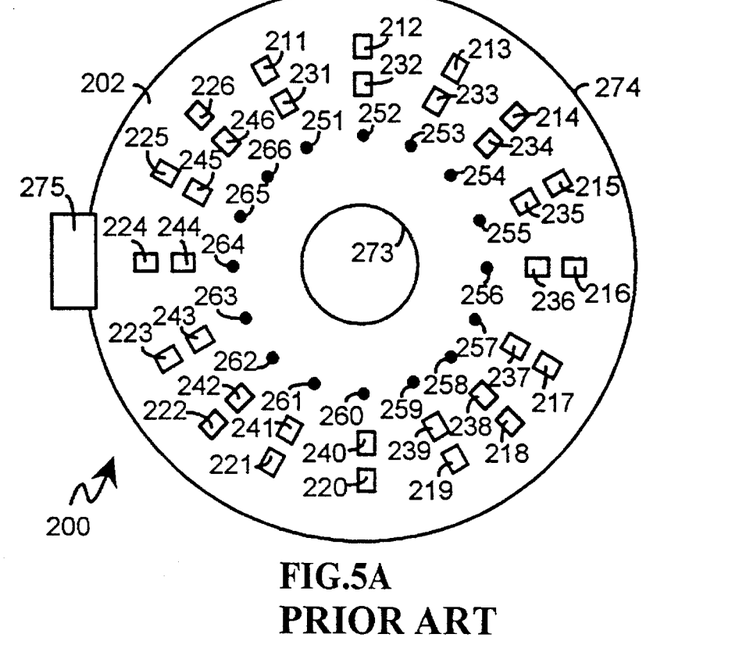
FIGS. 5A and 5B illustrate top and bottom plan views, respectively, of a simplified example of a prior art load board for providing test signals to the packaged integrated circuit of FIG. 2A during test.
Figure 5B:
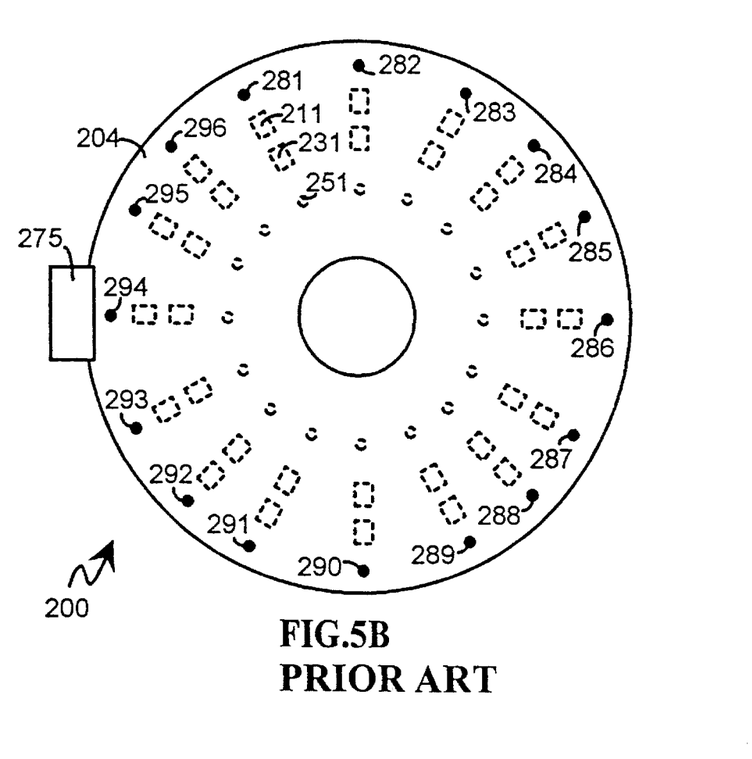
Figure 6:
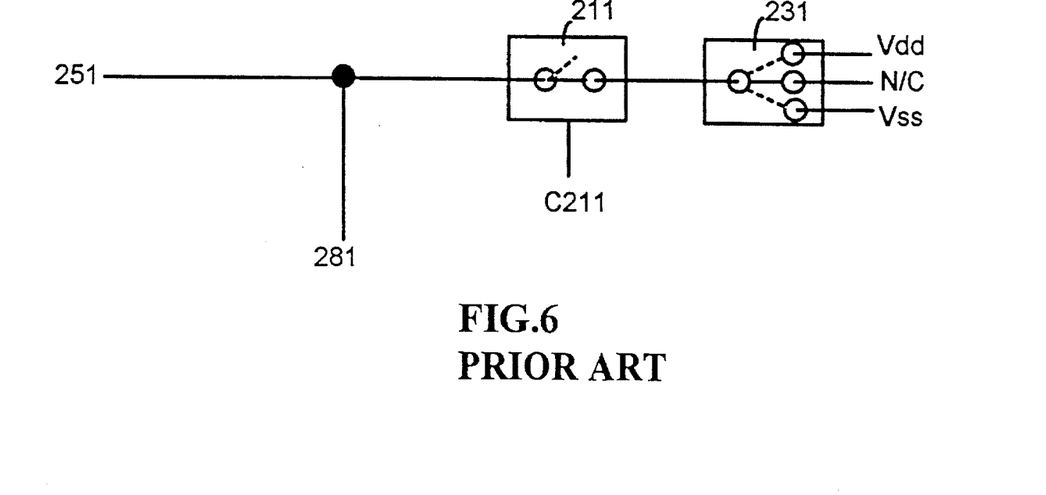
FIG. 6 illustrates an example of one of a plurality of similar circuits, one for each test channel, employed in the prior art load board of FIGS. 5A and 5B.

A more practical and therefore, commonly employed means of selectively connecting power or ground lines to any one of an integrated circuit's bond pads or pins is a so-called "killer board," a simplified example of which is depicted in FIGS. 5A and 5B, wherein FIG. 5A is a top plan view of the board and FIG. 5B is a bottom plan view. The "killer board" is a special type of load board which helps to connect each of the test channels to their assigned pins, and provides power or ground connections to the power and ground pins when the test channels of those pins are inactive. As schematically depicted in FIG. 6 for one test channel, each test channel is received by the "killer board" at an input contact (e.g., 281), which is internally connected by conventional means to both an output contact (e.g., 251) and an electrical relay (e.g., 211). The output contact (e.g., 251) of the "killer board" is in turn, connected to one of the pins of the packaged IC 110 under test, and the electrical relay (e.g., 211) is in turn, connected to an on-off-on switch or single-pole, triple throw ("SPTT") switch (e.g., 231) which is manually set to be connected to either the power line Vdd (e.g., 601), the ground line Vss (e.g., 602), or a no-contact position N/C.

Thereupon, when a particular test channel is to carry an input/output signal to the packaged IC 110 under test, its associated SPTT switch (e.g., 231) is manually set to the no-contact position N/C and/or its associated electrical relay (e.g., 211) is opened by an appropriate control signal to the relay's control input (e.g., C211). On the other hand, when the pin connected to the output contact (e.g., 251) of the "killer board" 140 is a power or ground pin, the test channel associated with that output contact (e.g., 251) is inactivated, the electrical relay (e.g., 211) associated with that output contact (e.g., 251) is closed by an appropriate signal to the relay's control input (e.g., C211), and the SPTT switch (e.g., 231) associated with that output contact (e.g., 251) is manually set to the appropriate power line Vdd (e.g., 601) or ground line Vss (e.g., 602) position.

Although the simplified "killer board" 200 depicted in FIGS. 5A and 5B only accommodates 16 test channels, it is to be appreciated that the example can be extended to higher and more practical numbers of test channels, such as for example, 256 test channels. Accordingly, as the number of test channels increase, the number of electrical relays and SPTT switches also increase proportionally, thus increasing the components cost of the "killer board" as well as increasing the complexity of its layout and as a result, board cost. In addition, as the number of test channels increase, the number of manual settings of the SPTT switches increase proportionally, thus increasing the set-up time and the likelihood that human error will cause errors in setting up the test configuration for each integrated circuit being tested.

SUMMARY OF THE INVENTION

Accordingly, one object of the present invention is to reduce the overall costs of test fixtures required for testing integrated circuits having different power and ground bond pad or pin configurations.

Another object is to reduce the set-up times required for testing integrated circuits having different power and ground bond pad or pin configurations.

Still another object is to reduce the chances of human error when setting up test configurations required for testing integrated circuits having different power and ground bond pad or pin configurations.

These and other objects are accomplished by the various aspects of the present invention, wherein briefly stated, one aspect is a low cost adapter unit (also referred to herein as a "programmable ring board") connectably mounted on a universal load board. The adapter unit is dedicated to testing integrated circuits having a specified power and ground bond pad or pin configuration. Integrated circuits having different power and ground bond pad or pin configurations each require a different adapter unit.

The load board is called universal, because the same load board is usable for testing each of the integrated circuits having different power and ground bond pad or pin configurations without manually altering the settings of any components on the load board. In particular, the universal load board of the present invention eliminates most of the electrical relays and all of the SPTT switches required for the "killer board" of the prior art, thus reducing both the components cost and layout complexity costs of the load board. The adapter unit is called low cost, because its cost is significantly less than that of the load board.

The adapter unit comprises a power bus connected to at least one power contact of the universal load board, a ground bus connected to at least one ground contact of the universal load board, and a plurality of power and ground jumpers respectively connecting power and ground signal contacts corresponding to a specific power and ground bond pad or pin configuration to the power and ground buses, respectively. It is to be noted, that the adapter unit is not limited to testing a specific integrated circuit, it is only limited to testing a specific power and ground bond pad or pin configuration. Integrated circuits having different input/outputs are equally compatible with the adapter unit as long as they each have the same power and ground bond pad or pin configuration.

In its preferred embodiment, the universal load board includes at least one power contact electrically connected to a power line, at least one ground contact electrically connected to a ground line, and a first and second plurality of signal contacts, wherein corresponding pairs of the first and second plurality of signal contacts are each electrically connected to both a corresponding one of the bond pads or pins of the integrated circuit being tested and to a corresponding one of the test channels from an integrated circuit tester. In its preferred embodiment, the adapter unit is doughnut shaped having a hole formed in its middle wherein a device-under-test board or a probe card can reside when mounted on the universal load board along with the adapter unit. The adapter unit includes a power bus electrically connected to the at least one power contact of the universal load board, a ground bus electrically connected to the at least one ground contact of the universal load board, and a plurality of signal contacts respectively electrically connected to corresponding ones of the universal load board second plurality of signal contacts. The adapter unit is thereupon dedicated to testing an integrated circuit having a particular power and/or ground bond pad and/or pin configuration by forming jumpers connecting signal contacts electrically connected to power bond pads and/or pins to the power bus, and jumpers connecting signal contacts electrically connected to ground bond pads and/or pins to the ground bus.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

Figure 7:
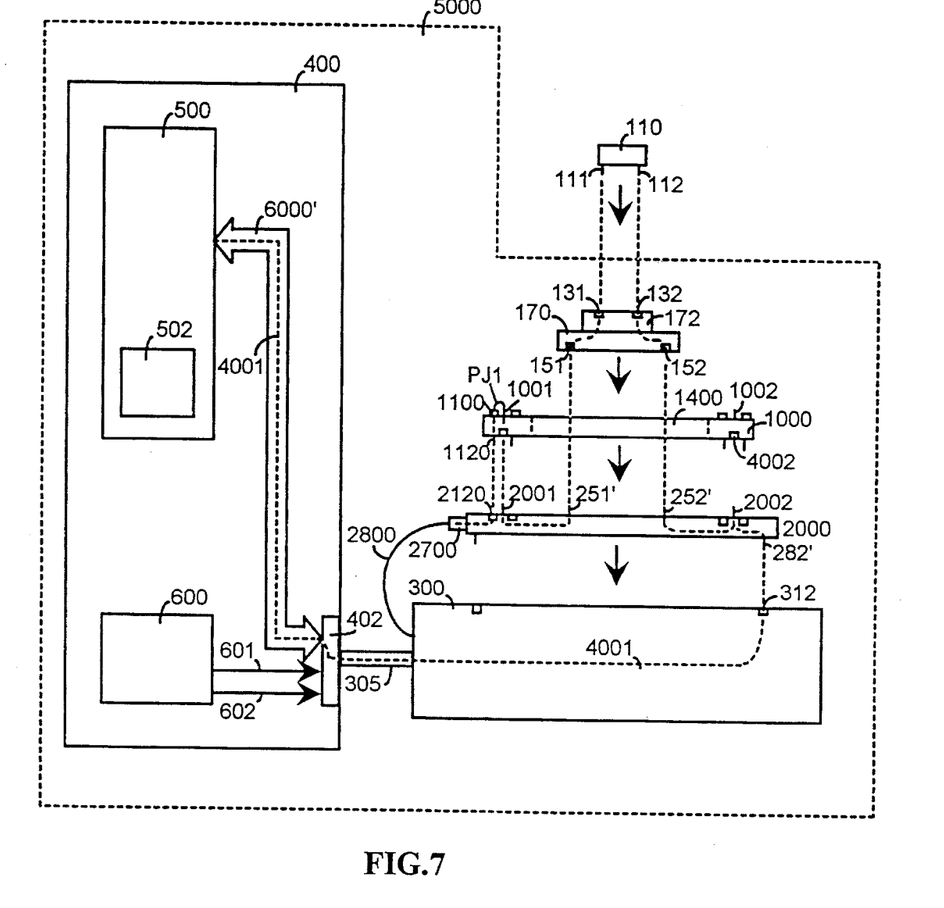
FIG. 7 illustrates a test system utilizing aspects of the present invention for testing integrated circuits.

FIG. 7 illustrates an integrated circuit test system 5000 readily adaptable for testing a variety of integrated circuits ("ICS") having different power and ground bond pad and/or pin configurations. To simplify its description, where components or structures of the test system 5000 are identical as those previously described in reference to the prior art test system 50 illustrated in FIG. 1, identical reference numbers are used to indicate such.

In the IC test system 5000, an IC tester 400 tests a packaged IC 110, for example, through a number of mechanical structures electrically interconnecting the two so that the IC tester 400 can stimulate the packaged IC 110 and determine whether the packaged IC 110 is good or bad by comparing its detected responses against expected responses to the stimulation. Although the IC test system 5000 is illustrated as testing a packaged IC, it is to be appreciated that the techniques and structures described herein are also readily adapted to testing IC die on wafers, for example, by replacing a device-under-test ("DUT") board 170 holding the packaged IC 110, with a probe card (not shown) having a plurality of needles, each respectively contacting one of the bond pads of the IC die selected to be tested. An example of such an IC test system is described in co-pending application Ser. No. 08/269,798, now U.S. Pat. No. 5,491,426 entitled "Adaptable Wafer Probe Assembly for Testing ICS with Different Power/Ground Bond Pad Configurations," filed by the same inventor and assigned to the same assignee as the present application, which description is herein incorporated by this reference.

The IC tester 400 includes a control unit 500 having a plurality of test channels 6000', wherein selected ones of the test channels 6000' are respectively assigned to the pins of the packaged IC 110 (e.g., pins 1–16 making electrical connection in sequential one-to-one correspondence with test channels 6001–6016 of test channels 6000' such that pin 1 is electrically connected to test channel 6001, pin 2 is electrically connected to test channel 6002, and so on, to pin 16 which is electrically connected to test channel 6016). The IC tester 400 also includes a programmable power supply unit 600 having a power line 601 and a ground line 602, which are connected along with at least the selected ones of the test channels 6000' to a connector 402. Associated with the control unit 500 is a precision measurement unit ("PMU") 502 for testing certain analog characteristics of the packaged IC 110, for example, such as device current.

During digital testing of the packaged IC 110, if the pin assigned to a selected test channel is an input and/or output ("I/O") pin, then the selected test channel carries I/O signals between the control unit 500 and the packaged IC 110. On the other hand, if the pin assigned to the selected test channel is a power or ground pin, the selected test channel is inactive and separate means is provided to connect, as appropriate, the power line 601 or the ground line 602 to that pin. During analog testing of the packaged IC 110, if the pin assigned to a selected test channel is a certain power pin from which a device current, for example, is to be measured, then the selected test channel may be reactivated to carry certain signals and/or responses between the PMU 502 and the packaged IC 110.

The selected test channels (e.g., 6001–6016), the power line 601, and the ground line 602 are provided to the packaged IC 110 through a number of mechanical structures including a test head 300 connected to the IC tester 400 by a cable 305, and the DUT board 170 upon which the packaged IC 110 is mounted in an IC holder or socket 172. In addition to the test head 300 and the DUT board 170 are two additional mechanical structures, which provide means utilizing aspects of the present invention, to connect the I/O pins, power pins, and ground pins of the packaged IC 110 to their corresponding test channels, power line 601, and ground line 602, respectively.

Figure 9A:
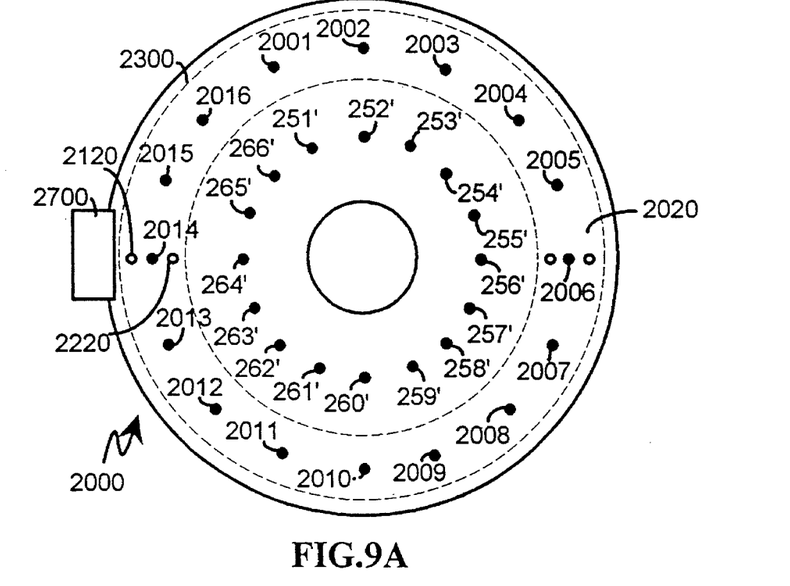
FIGS. 9A and 9B illustrate top and bottom plan views, respectively, of a load board used in conjunction with the adaptor unit of FIGS. 8A and 8B, utilizing aspects of the present invention.
Figure 9B:
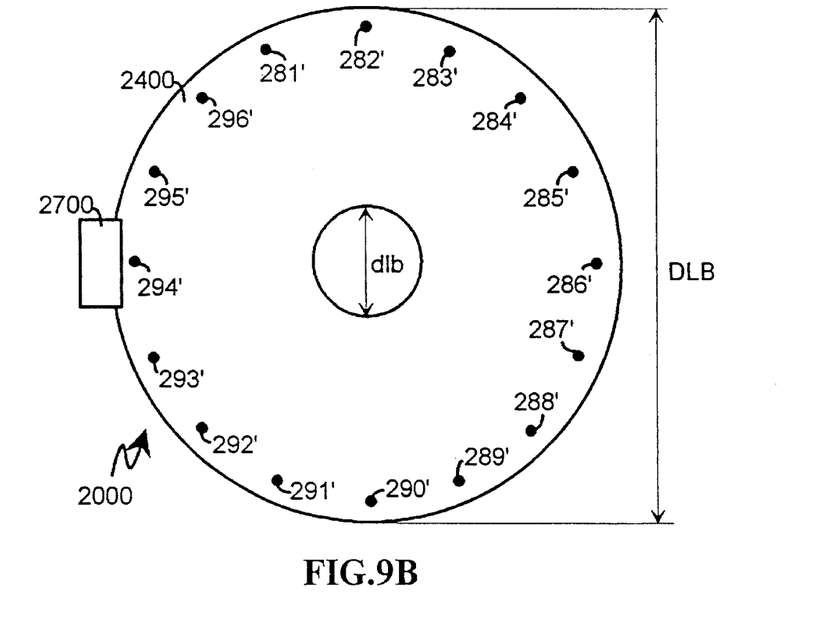

FIGS. 9A and 9B illustrate top and bottom plan views, respectively, of the first of these two structures, an universal load board 2000. The load board 2000 is called "universal", because unlike the "killer board" 200 (FIGS. 5A and 5B) of the prior art, the universal load board 2000 does not necessarily include any switchable components, such as, for example, SPTT switches, for selectably connecting the power and ground pins of the packaged IC 110 to the power and ground lines, 601 and 602, respectively, when digitally testing a variety of ICS having different power and ground pin configurations.

Since the universal load board 2000 does not require the plurality of SPTT switches 231–246 and plurality of relays 211–226 of the "killer board" 200 for digitally testing the packaged IC 110, the component cost of the universal load board 2000 is significantly less than that of the "killer board" 200 (FIGS. 5A and 5B). In addition, by eliminating these components, the number of conductive traces to be formed through one or more layers of the printed circuit board forming the base of the universal load board 2000 is significantly reduced and as a consequence, the cost of the printed circuit board may be significantly reduced.

On a top surface 2300 (FIG. 9A) of the universal load board 2000 are formed a first plurality of top surface signal contacts 251'–266' adapted to connect and communicate with the DUT board 170 in identical fashion as their unprimed counterparts 251–266 on the prior art load board 200 (FIG. 5A), and on a bottom surface 2400 (FIG. 9B) of the universal load board 2000 are formed a plurality of bottom surface signal contacts 281'–296' also adapted to connect and communicate with the test head 300 in identical fashion as their unprimed counterparts 281–296 on the prior art load board 200 (FIG. 5B). The top and bottom surface contacts, 251'–266' and 281'–296', respectively, are denoted as being primed, because although they function identically as their unprimed counterparts with respect to the DUT board 170 and test head 300, their connections within the universal load board 2000 are substantially different than the connections of their unprimed counterparts within the "killer board" 200.

Also on the top surface 2300 (FIG. 9A) of the universal load board 2000 are formed, in an area 2020, a second plurality of top surface signal contacts 2001–2016, at least one power contact 2120 connected through conventional means to the power line 601 provided from the test head 300 to the universal load board 2000, for example, via ribbon cable 2800 connected to connector 2700, and at least one ground contact 2220 connected through conventional means to the ground line 602 also provided from the test head 300 to the universal load board 2000, for example, via ribbon cable 2800. The second plurality of top surface signal contacts 2001–2016 are connected through conventional means in sequential one-to-one correspondence with the first plurality of top surface signal contacts 251'–266' such that both signal contacts 2001 and 251' are connected to both pin 1 of packaged IC 110 and test channel 6001, both signal contacts 2002 and 252' are connected to both pin 2 of packaged IC 110 and test channel 6002, and so on, to both signal contacts 2016 and 266' being connected to both pin 16 and test channel 6016 when testing the packaged IC 110.

With the inner and outer diameters, dlb and DLB, of the universal load board 2000 preferably the same as those of the prior art load board 200, the area 2020 corresponds to the area of the prior art load board 200 (FIG. 5A) wherein the plurality of SPTT switches 231–246 and relays 211–226 are mounted, and is further defined by inner and outer concentric circles (shown as dotted circles in FIG. 9A) wherein the first plurality of top surface signal contacts 251'–266' are formed within both the inner and outer concentric circles and the second plurality of top surface signal contacts 2001–2016 are formed only within the outer concentric circle.

Figure 8A:
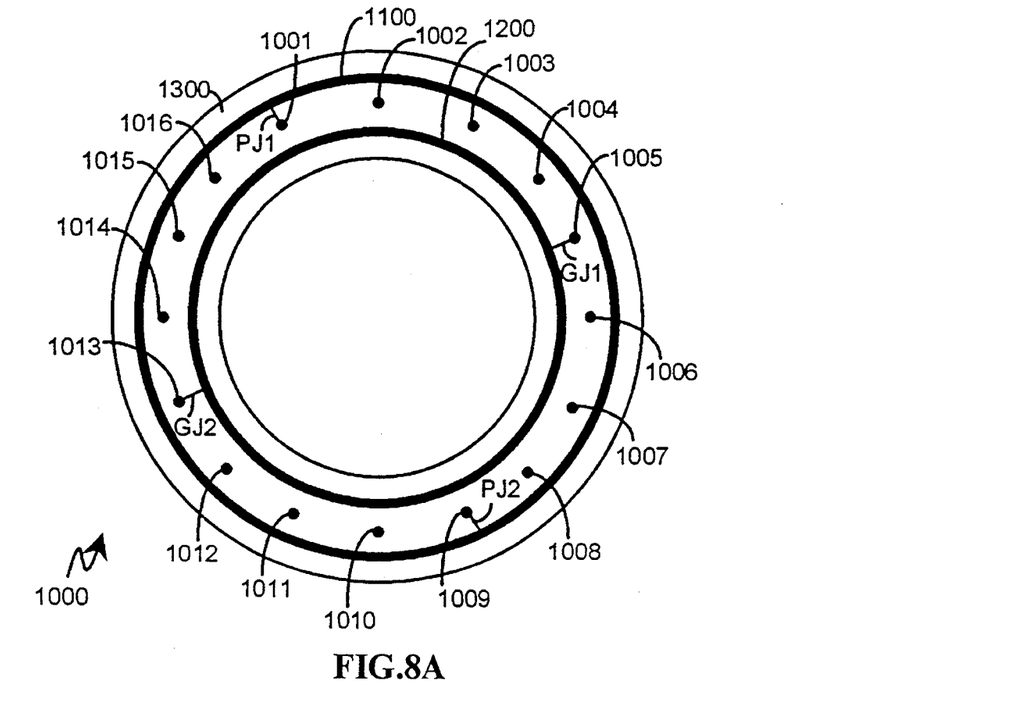
FIGS. 8A and 8B illustrate top and bottom plan views, respectively, of an adapter unit utilizing aspects of the present invention.
Figure 8B:
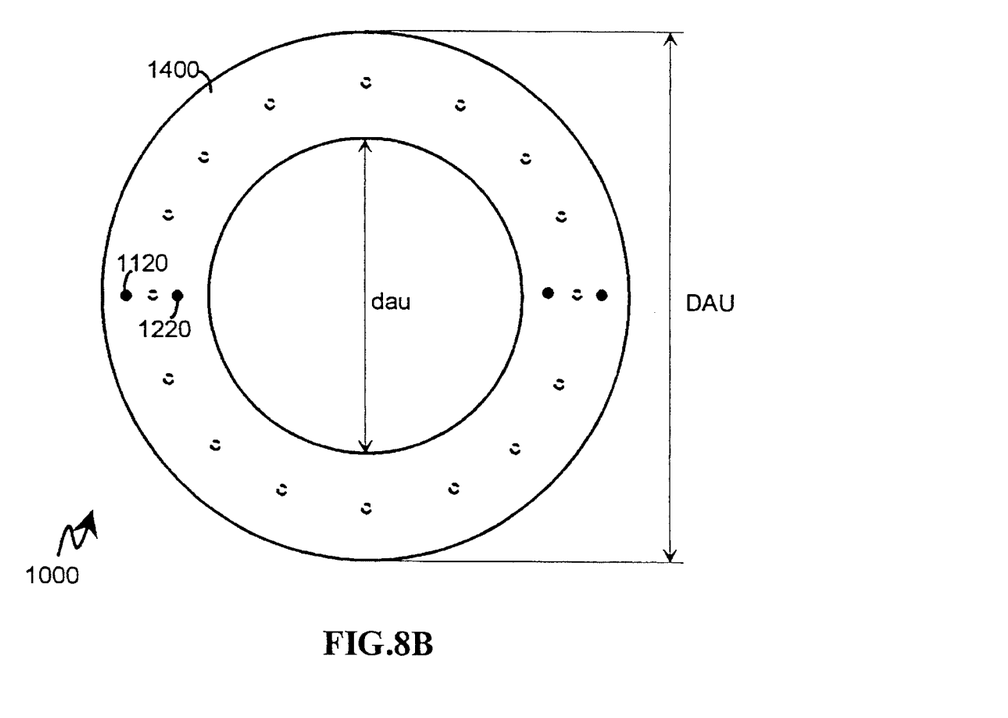

FIGS. 8A and 8B illustrate top and bottom plan views, respectively, of the second of the two structures, an adapter unit 1000 (also referred to herein as a "programmable ring board"). The adapter unit or programmable ring board 1000 is by nature of its simple construction, a low cost means of selectably connecting each of the power pins of the packaged IC 110 to the power line 601, and each of the ground pins of the packaged IC 110 to the ground line 602. The adapter unit 1000 is preferably doughnut shaped having an inner diameter "dau" and outer diameter "DAU" wherein the inner diameter "dau" is preferably greater than or equal to the diameter of the inner concentric circle of the area 2020 on the universal load board 2000, and the outer diameter "DAU" is preferably less than or equal to the diameter of the outer concentric circle of the area 2020 on the universal load board 2000. As a consequence, when the adapter unit 1000 is mounted on the universal load board 2000, it resides over an area of the top surface 2300 of the universal load board 2000 within the area 2020.

The adapter unit 1000 is unique to one of a variety of IC having different power and ground bond pad and/or pin configurations. For example, the adapter unit 1000 illustrated in FIGS. 8A and 8B, is specially constructed to test either an IC die having a bond pad configuration such as that depicted in FIG. 2B, or a packaged IC having a pin out configuration such as that depicted in FIG. 3B. When testing ICS having different power and ground bond pad and/or pin configurations, different adapter units specially adapted to test those different configurations are required.

On a top surface 1300 (FIG. 8A) of the adapter unit 1000, a plurality of signal contacts 1001–1016, a power bus ring 1100, and a ground bus ring 1200 are formed. The signal contacts 1001–1016 preferably extend through the adapter unit 1000 so as to form contacts (e.g., dotted circles) on a bottom surface 1400 (FIG. 8B) of the adapter unit 1000 which make electrical connections with corresponding ones of the second plurality of signal contacts 2001–2016 of the universal load board 2000 when the adapter unit 1000 is properly mounted on the universal load board 2000 (e.g., contacts 1001–1016 making electrical connection in sequential one-to-one correspondence with contacts 2001–2016 such that contact 1001 is connected to both pin 1 of the packaged IC 110 and test channel 6001 of the IC tester 400, contact 1002 is connected to both pin 2 of the packaged IC 110 and test channel 6002 of the IC tester 400, and so on, to contact 1016 being connected to both pin 16 of the packaged IC 110 and test channel 6016 of the IC tester 400 when the testing the packaged IC 110). Also formed on the bottom surface 1400 (FIG. 8B) of the adapter unit 1000 are at least one power contact 1120 connected through conventional means to the power bus ring 1100 formed on the top surface 1300 (FIG. 8A) of the adapter unit 1000, and at least one ground contact 1220 connected through conventional means to the ground bus ring 1200 formed on the top surface 1300 (FIG. 8A) of the adapter unit 1000. The at least one power contact 1120 of the adapter unit 1000 is preferably formed such that it makes electrical contact with the at least one power contact 2120 of the universal load board 2000 when the adapter unit 1000 is mounted on the universal load board 2000, and the at least one ground contact 1220 of the adapter unit 1000 is also preferably formed such that it makes electrical contact with the at least one ground contact 2220 of the universal load board 2000 when the adapter unit 1000 is mounted on the universal load board 2000. As a consequence, the power line 601 is connected to the power bus ring 1100 and the ground line 602 is connected to the ground bus ring 1200 when the adapter unit 1000 is properly mounted on the universal load board 2000 for testing the packaged IC 110.

Each adapter unit 1000 is customized for a particular power and ground bond pad and/or pin configuration by forming a power jumper (e.g., PJ1 and PJ2) between the power bus ring 1100 and a respective one of the signal contacts 1001–1016 which corresponds to a power bond pad or pin, and by forming a ground jumper (e.g., GJ1 and GJ2) between the ground bus ring 1200 and each of the signal contacts 1001–1016 which corresponds to a ground bond pad or pin. For example, FIG. 8A illustrates an adapter unit 1000 configured to test ICS having a power and ground bond pad configuration such as that depicted in FIG. 1B or power and ground pin configuration such as that depicted in FIG. 2B, by forming power jumpers PJ1 and PJ2 between the power bus ring 1100 and signal contacts 1001 and 1009, respectively, and by forming ground jumpers GJ1 and GJ2 between the ground bus ring 1200 and signal contacts 1005 and 1013, respectively.

The DUT board 170 is also mounted on the universal load board 2000 in the same fashion as it would be mounted on the prior art load board 200. In particular, the DUT board 170 is mounted on the universal load board 2000 such that it resides in a hole area 1400 of the adapter unit 1000 (e.g., area defined by diameter "dau"), and its bottom surface signal contacts 151–166 (shown as dotted circles in FIG. 4) respectively contact the first plurality of top surface signal contacts 251'–266' of the universal load board 2000. Since the contacts 151–166 of the DUT board 170 respectively connect with pins 1–16 of the packaged IC 110, mounting the DUT board 170 in such a fashion causes each of the pins 1–16 of the packaged IC 110 to be electrically connected to corresponding test channels 6001–6016 of the IC tester 400 as well as corresponding signal contacts 1001–1016 of the adapter unit 1000.

Consequently, with the adapter unit 1000 properly configured for the power and ground bond pad and/or pin configuration as previously described, each power pin of the packaged IC 110 is connected to both the power line 601 and its respective test channel which is inactive and each ground pin of the packaged IC 110 is connected to both the ground line 602 and its respective test channel which is inactive. Power is thereupon applied to the power pins (e.g., pins 1 and 9) of the packaged IC 110 through their corresponding first and second plurality of top surface signal contacts (e.g., 251' and 2001, respectively, and 259' and 2009, respectively) which are connected to the power line 601 through power jumpers (e.g., PJ1 and PJ2) connected to the power bus ring 1100 of the adapter unit 1000, while their respective test channels are inactive. Likewise, the ground pins (e.g., pins 5 and 13) of the packaged IC 110 are connected to the ground line 602 through their corresponding first and second plurality of top surface signal contacts (e.g., 255' and 2005, respectively, and 263' and 2013, respectively) which are connected to the ground line 602 through ground jumpers (e.g., GJ1 and GJ2) connected to the ground bus ring 1200 of the adapter unit 1000, while their respective test channels are inactive. Meanwhile, all I/O pins (e.g., pin 2) of the packaged IC 110 carry their respective I/O signals through their respective test channels which are active.

Although not shown on the universal load board 2000, it may also be desirable to include one or more relays connected to either or both the power bus ring 1100 and the ground bus ring 1200 for testing certain analog characteristics of the packaged IC 110. For example, when the PMU 502 is testing the packaged IC 110 for device current, the device current may be measured by disconnecting the power line 601 to all of the power pins (e.g., pins 1 and 9) of the packaged IC 110, by switching a relay provided on the universal load board 2000 and connected to the power bus ring 1100, and reactivating one of the test channels (e.g., 6001) associated with one of the power pins (e.g., pin 1) so that the device current can be measured through that test channel. Since only one relay is required to disconnect the power bus ring 1100 and only one relay is required to disconnect the ground bus ring 1200, only two relays in total are required for analog testing of the packaged IC 110. It is to be appreciated that this is a significant reduction in the number of relays, as compared with the "killer board" 200 (FIGS. 5A and 5B) which required one relay for each test channel. In addition to the reduction in the number of relays, the number of control lines connected to those relays is also substantially reduced, thus reducing the number of lines required on the ribbon cable 2800, for example, if the control signals are provided through separate control lines on that ribbon cable.

Although the various aspects of the present invention have been described with respect to a preferred embodiment, it will be understood that the invention is entitled to full protection within the full scope of the appended claims.

What is claimed is:

1. In an integrated circuit test system for testing an integrated circuit having a plurality of bond pads including a plurality of power pads, a plurality of ground pads, and a plurality of signal pads, defining a power and ground bond pad configuration, said integrated circuit test system including power and ground lines, a control unit, and a load board, said control unit having a plurality of test channels, said load board having at least one power contact connected to said power line, at least one ground contact connected to said ground line, and a plurality of signal contacts, wherein each bond pad of said integrated circuit is connected to a corresponding test channel of said control unit through a corresponding signal contact of said load board, said integrated circuit test system further having an adapter unit connectably mounted on said load board and corresponding to the power and ground bond pad configuration of the integrated circuit being tested, said adapter unit comprising:

a power bus electrically connected to said at least one power contact of said load board;

a ground bus electrically connected to said at least one ground contact of said load board;

a plurality of power jumpers, wherein each load board signal contact connected to one of said plurality of power pads of said integrated circuit is connected to said power bus by a corresponding one of said plurality of power jumpers, and the test channel connected to said load board signal contact connected to said one of said plurality of power pads of said integrated circuit is inactive; and a plurality of ground jumpers, wherein each load board signal contact connected to one of said plurality of ground pads of said integrated circuit is connected to said ground bus by a corresponding one of said plurality of ground jumpers, and the test channel connected to said load board signal contact connected to said one of said plurality of ground pads of said integrated circuit is inactive.

2. The adapter unit as recited in claim 1, further comprising a printed circuit board having a top surface upon which said power bus and said ground bus are formed, and a bottom surface having at least one power contact connecting said power bus to said at least one power contact of said load board and at least one ground contact connecting said ground bus to said at least one ground contact of said load board when said adapter unit is connectably mounted on said load board.

3. The adapter unit as recited in claim 2, wherein said power and ground buses are formed as concentric circles on a top surface of said adapter unit.

4. The adapter unit as recited in claim 3, further comprising a plurality of signal contacts defining a concentric circle formed between said concentric circles of said power and ground buses, each of said plurality of signal contacts of said adapter unit connected to a corresponding one of said plurality of signal contacts of said load board, wherein each of said plurality of power jumpers is connected to an adapter signal contact connected to a load board signal contact connected to one of said plurality of power pads, and each of said plurality of ground jumpers is connected to an adapter signal contact connected to a load board signal contact connected to one of said plurality of ground pads.

5. The adapter unit as recited in claim 2, said integrated test system having a probe card for probing said integrated circuit die, and said adapter unit being doughnut shaped and having as a consequence thereof an inner hole area, wherein said adapter unit and probe card are both mounted on said load board when testing said integrated circuit being tested such that probe card resides within said inner hole area of said adapter unit.

6. In an integrated circuit test system for testing a packaged integrated circuit having a plurality of pins including a plurality of power pins, a plurality of ground pins, and a plurality of signal pins, defining a power and ground pin configuration, said integrated circuit test system including power and ground lines, a control unit, and a load board, said control unit having a plurality of test channels, said load board having at least one power contact connected to said power line, at least one ground contact connected to said ground line, and a plurality of signal contacts, wherein each pin of said packaged integrated circuit is connected to a corresponding test channel of said control unit through a corresponding signal contact of said load board, said integrated circuit test system further having an adapter unit connectably mounted on said load board and corresponding to the power and ground pin configuration of the integrated circuit being tested, said adaptor unit comprising:

a power bus electrically connected to said at least one power contact of said load board;

a ground bus electrically connected to said at least one ground contact of said load board;

a plurality of power jumpers, wherein each load board signal contact connected to one of said plurality of power pins of said packaged integrated circuit is connected to said power bus by a corresponding one of said plurality of power jumpers, and the test channel connected to said load board signal contact connected to said one of said plurality of power pins of said packaged integrated circuit is inactive; and a plurality of ground jumpers, wherein each load board signal contact connected to one of said plurality of ground pins of said packaged integrated circuit is connected to said ground bus by a corresponding one of said plurality of ground jumpers, and the test channel connected to said load board signal contact connected to said one of said plurality of ground pins of said packaged integrated circuit is inactive.

7. The adapter unit as recited in claim 6, further comprising a printed circuit board having a top surface upon which said power bus and said ground bus are formed, and a bottom surface having at least one power contact connecting said power bus to said at least one power contact of said load board and at least one ground contact connecting said ground bus to said at least one ground contact of said load board when said adapter unit is connectably mounted on said load board.

8. The adapter unit as recited in claim 7, wherein said power and ground buses are formed as concentric circles on a top surface of said adapter unit.

9. The adapter unit as recited in claim 8, further comprising a plurality of signal contacts defining a concentric circle formed between said concentric circles of said power and ground buses, each of said plurality of signal contacts of said adapter unit connected to a corresponding one of said plurality of signal contacts of said load board, wherein each of said plurality of power jumpers is connected to an adapter signal contact connected to a corresponding load board signal contact connected to one of said plurality of power pins, and each of said plurality of ground jumpers is connected to an adapter signal contact connected to a corresponding load board signal contact connected to one of said plurality of ground pins.

10. The adapter unit as recited in claim 7, said integrated test system having a device-under-test board upon which said integrated circuit being tested is mounted, and said adapter unit being doughnut shaped and having as a consequence thereof an inner hole area, wherein said adapter unit and device-under-test board are both mounted on said load board when testing said integrated circuit being tested such that device-under-test board resides within said inner hole area of said adapter unit.

11. An integrated circuit test system for testing an integrated circuit having a plurality of contacts including a plurality of power contacts, a plurality of ground contacts, and a plurality of signal contacts defining a power and ground contact configuration, said integrated circuit test system comprising:

a power line;

a ground line;

a control unit having a plurality of test channels;

a load board having at least one power contact connected to said power line, at least one ground contact connected to said ground line, a plurality of signal contacts respectively connected to both corresponding test channels of said control unit and corresponding contacts of said integrated circuit, said plurality of load board signal contacts including a plurality of power signal contacts connected to said plurality of power contacts of said integrated circuit and a plurality of ground signal contacts connected to said plurality of ground contacts of said integrated circuit; and an adapter unit connectably mounted on said load board and corresponding to the power and ground contact configuration of the integrated circuit being tested, said adapter unit having a power bus connected to said at least one power contact of said load board, a ground bus connected to said at least one ground contact of said load board, a plurality of power jumpers connecting corresponding power signal contacts of said load board to said power bus while corresponding test channels connected to said power signal contacts are inactive, and a plurality of ground jumpers connecting corresponding ground signal contacts of said load board to said ground bus while corresponding test channels connected to said ground signal contacts are inactive.

12. The integrated circuit test system as recited in claim 11, wherein said adapter unit includes a printed circuit board having a top surface upon which said power bus and said ground bus are formed as concentric circles, and a bottom surface having at least one power contact connecting said power bus to said at least one power contact of said load board and at least one ground contact connecting said ground bus to said at least one ground contact of said load board when said adapter unit is connectably mounted on said load board.

13. The integrated circuit test system as recited in claim 12, wherein said adapter unit further comprises a plurality of signal contacts defining a concentric circle formed between said concentric circles of said power and ground buses, each of said plurality of signal contacts of said adapter unit connected to a corresponding one of said plurality of signal contacts of said load board, wherein each of said plurality of power jumpers is connected to an adapter signal contact connected to a load board power signal contact, and each of said plurality of ground jumpers is connected to an adapter signal contact connected to a load board ground signal contact.

14. The integrated circuit test system as recited in claim 13, said integrated test system further comprising a device-under-test board upon which said integrated circuit being tested is mounted, and said adapter unit being doughnut shaped and having as a consequence thereof an inner hole area, wherein said adapter unit and device-under-test board are both mounted on said load board when testing said integrated circuit being tested such that device-under-test board resides within said inner hole area of said adapter unit.

15. The integrated circuit test system as recited in claim 11, further comprising a precision measurement unit, wherein said load board includes a relay for programmably connecting a power signal contact of said load board to a corresponding power contact of said integrated circuit when said precision measurement unit is not connected to said power signal contact of said load board, and disconnecting said power signal contact of said load board from said corresponding power contact of said integrated circuit when said precision measurement unit is connected to said power signal contact of said load board through a corresponding test channel connected to said power signal contact of said load board.

16. A load board assembly useful for testing an integrated circuit in conjunction with an integrated circuit tester having a plurality of test channels, a power line, and a ground line, said integrated circuit having a plurality of contacts including at least one power contact and at least one ground contact defining a power and ground contact configuration, said load board assembly comprising:

a universal load board having at least one power contact electrically connected to said power line of said integrated circuit tester, at least one ground contact electrically connected to said ground line of said integrated circuit tester, and a first and second plurality of signal contacts, wherein corresponding pairs of said first and second plurality of signal contacts are electrically connected to both a corresponding one of said plurality of contacts of said integrated circuit and a corresponding one of said plurality of test channels of said integrated circuit tester; and an adapter unit corresponding to the power and ground contact configuration of the integrated circuit being tested, and having a power bus electrically connected to said universal load board power contact, a ground bus electrically connected to said universal load board ground contact, a plurality of signal contacts connected to corresponding ones of said universal load board second plurality of signal contacts, at least one power jumper electrically connecting said at least one integrated circuit power contact to said power bus while corresponding test channels connected to said at least one integrated circuit power contact are inactive, and at least one ground jumper electrically connecting said at least one integrated circuit ground contact to said ground bus while corresponding test channels connected to said at least one integrated circuit ground contact are inactive.

\* \* \* \* \*